United States Patent [19]

Sparrowhawk

[11] Patent Number: 4,707,680

[45] Date of Patent: Nov. 17, 1987

[54] SAMPLE ISOLATION IN INTEGRATING ANALOG-TO-DIGITAL CONVERTERS

[75] Inventor: Bryan L. Sparrowhawk, Everett, Wash.

[73] Assignee: John Fluke Mfg. Co., Inc., Everett, Wash.

[21] Appl. No.: 836,121

[22] Filed: Mar. 4, 1986

[51] Int. Cl.⁴ .............................................. H03M 1/52
[52] U.S. Cl. ........................... 340/347 NT; 324/78 D; 324/99 D; 340/347 AD; 340/347 CC; 340/347 M
[58] Field of Search ................. 340/347 NT, 347 AD, 340/347 CC, 347 M; 324/99 D, 78 D

[56] References Cited

U.S. PATENT DOCUMENTS 4,090,192 5/1978 Shuttleworth ............... 340/347 NT
4,556,867 12/1985 George ....................... 340/347 M X Primary Examiner—T. J. Sloyan
Attorney, Agent, or Firm—Stephen A. Becker

[57] ABSTRACT

To eliminate crosstalk between successive measurements of an integrating analog-to-digital converter having MOS linear amplifiers (16) that as a result of ion distribution shift in its input devices gate oxide (24) tends to retain a conversion residue (R), at least one "dummy" conversion cycle (38) is executed prior to each input signal measurement. The "dummy" conversion cycle (38) reduces the residue (R) by moving input gate ions into stable positions corresponding to the magnitude of the input signal to be next measured.

11 Claims, 8 Drawing Figures

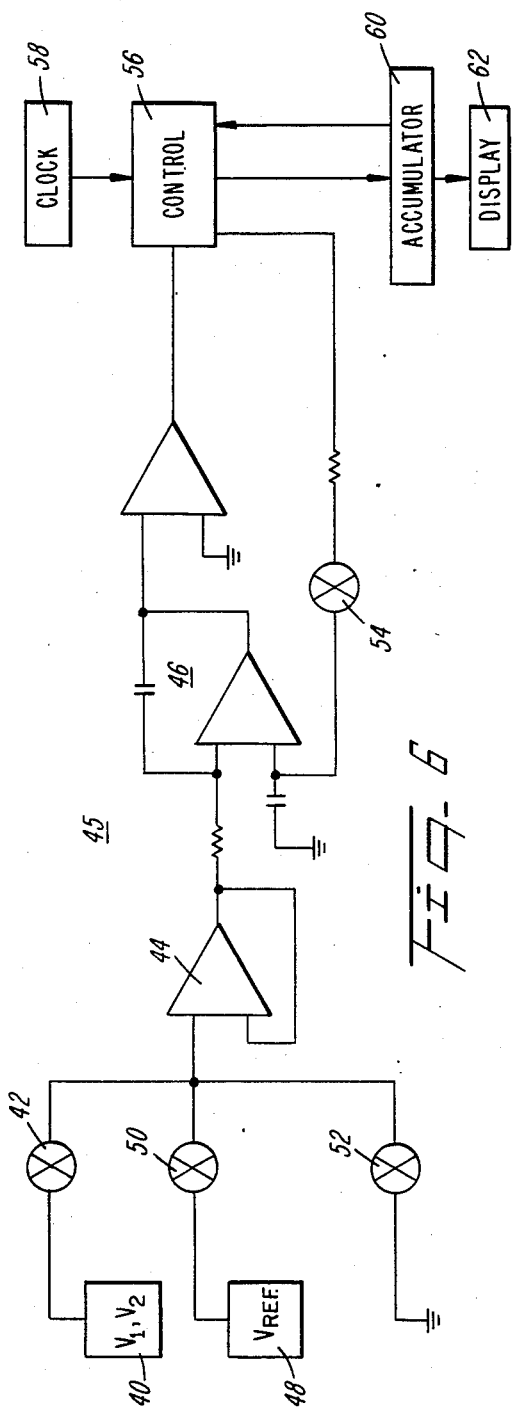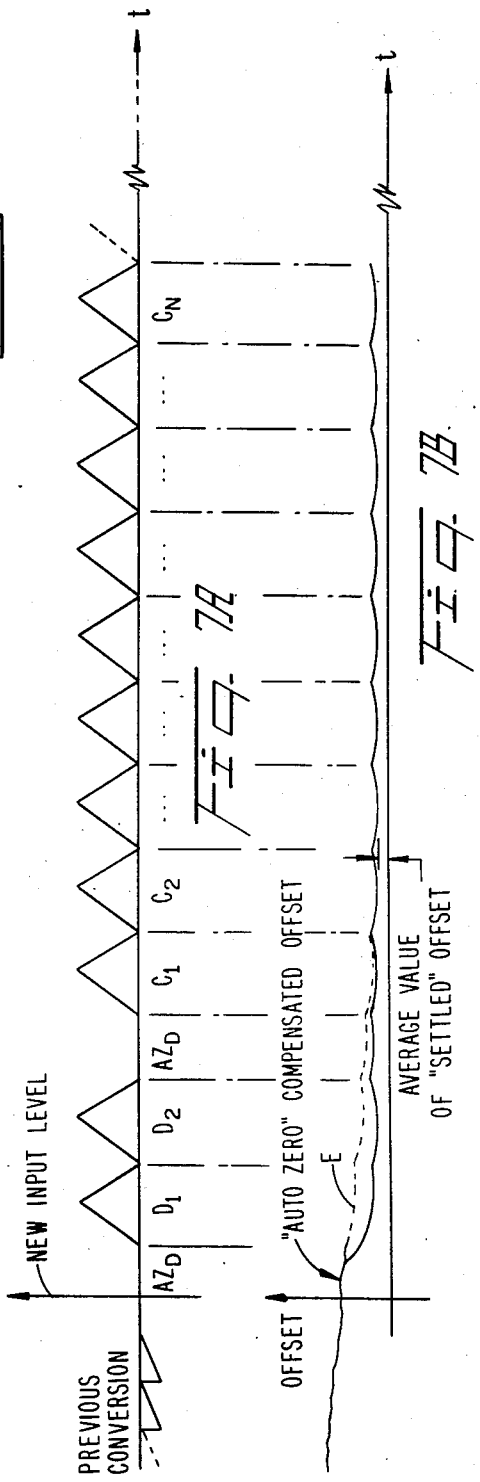

SAMPLE ISOLATION IN INTEGRATING ANALOG-TO-DIGITAL CONVERTERS

TECHNICAL FIELD

The invention relates generally to integrating analog-to-digital converters having metal-oxide-silicon (MOS) input stages, and more particularly toward reduction of crosstalk between successive measurements caused by ionic migration that tends to occur in the input gate oxide layers of MOS devices within such converters.

BACKGROUND ART

In many applications, such as in temperature measurement using thermocouples, an analog signal must be converted to a corresponding digital signal for data processing or display. Dual-slope integration type analog-to-digital converters are commonly preferred because the conversion accuracy and resolution as well as differential linearity inherent in them are excellent. Furthermore, dual-slope converters exhibit high normal-mode noise rejection and have relatively low long term drift. Dual-slope converters as well as numerous other analog-to-digital conversion techniques are described in Chapter 5 of Hnatek, Eugene, "A Users Handbook of D/A and A/D Converters", John Wiley & Sons, Inc., 1976.

In dual-slope conversion, an unknown input signal is first integrated for a fixed period of time, and the reference signal of a polarity opposite that of the input signal. The length of time required for the integrator to return to zero is proportional to the average magnitude of the input signal over the integration period. Referring to FIG. 1, for example, a two-channel analog-to-digital converter 10 for sampling alternately two different input voltages $V_{in1}$ and $V_{in2}$ comprises an integrator 12 that receives an input voltage $V_{in1}$ or $V_{in2}$ through a switch 14 and an amplifier 16. The switch 14, which preferably is formed of solid state switching circuitry controlled by a control unit 18, has its inputs connected to the two input voltage sources $V_{in1}$, $V_{in2}$ and to a reference voltage source $V_{ref}$ 20. The polarity of $V_{ref}$ 20 is opposite that of whichever one of input voltage $V_{in1}$ or $V_{in2}$ is being measured.

The output of integrator 12 is applied to a comparator 22 which compares the magnitude of the integrated input voltage with ground or with some other reference level that is intermediate the magnitude of the input voltage $V_{in1}$, $V_{in2}$ being measured and the reference voltage $V_{ref}$. A constant rate clock within control unit 18 establishes a timing base for controlling the operation of integrator 12.

The operation of the conventional dual-slope analog-to-digital converter is described with reference to FIG. 2 showing a dual-slope conversion cycle consisting of three regions, Auto-Zero, Integrate and De-Integrate, respectively. During Auto-Zero, errors in analog components of the converter are nulled by storing error information on an "Auto-Zero" capacitor (not shown in FIG. 1). During Integrate, the input voltage $V_{in1}$ or $V_{in2}$ being measured by switch 14 is integrated by 12 for a fixed time period $T_1$ determined by control unit 18. During De-Integrate, with switch 14 connected to $V_{ref}$ 20, the integrated input voltage is de-integrated by 12 toward $V_{ref}$. The time $T_2$ required for output of integrator 12 to intersect ground potential is applied to a counter (not shown) which drives a digital display or is applied to a microcomputer or other circuitry for further processing.

The conversion cycle illustrated in the graph of FIG. 2 corresponds to a single input voltage measurement, that is, measurement of either $V_{in1}$ or $V_{in2}$ in FIG. 1. The graph of FIG. 3, however, shows two successive conversion cycles wherein switch 14 is first connected to $V_{in1}$ to integrate for the fixed time $T_1$ followed by de-integration toward $V_{ref}$ and then is connected to a smaller input signal $V_{in2}$ to integrate for the time $T_1$ followed again by de-integration toward $V_{ref}$. The de-integration times $T_2$ associated with the $V_{in1}$ and $V_{in2}$ measurements are proportional to the magnitudes of the two input voltages, respectively.

Ideally, the two conversions corresponding to input signals $V_{in1}$ and $V_{in2}$ are mutually independent. As a practical matter, however, if amplifier 16 (FIG. 1) has a metal-oxide-silicon (MOS) input stage, as is commonly the case, they are not. This phenomenon depicted in FIG. 3 by a distortion in the $V_2$ cycle waveform compared to the ideal waveform (dotted lines) is believed to be caused by ionic migration within the input gate isolation layer 24 (FIG. 4) of the amplifier 14.

The structure and operation of MOS devices as well as of operational amplifiers employing such devices being well known are not described in detail herein. In general, however, the input stage devices of the amplifier 16 comprises a silicon substrate 26 having source 28 and drain 30 diffusions on opposite sides of and beneath gate 32. A gate metallization layer 32 on the upper surface of isolation layer 24, itself formed of silicon dioxide, receives an external control voltage that establishes within the substrate 26 a channel region which controls current flow through the substrate between the drain and source. The mechanisms that take place within isolation layer 24 as sodium ions therein drift in response to an applied gate voltage and change the threshold of the input stage devices of the amplifier 16, and correspondingly alter the offset of the converter 10 are not well known. We believe, however, that the distortion shown in an exaggerated form in FIG. 3 arises as a result of a tendency of free ions in the oxide layer to "stick" in positions established by the input voltage applied during the most recent conversion cycle. The waveform distortion appears to be a function of the magnitude and duration of the signal previously applied to be measured, similar to the capacitive effect known as dielectric absorption. In any case, the de-integration period shown in a solid line in FIG. 3 to be measured to determine input voltage magnitude is somewhat greater than that which would have occured in the absence of the distortion (see the dotted lines in the Figure) inducing in the measurement an error corresponding to $\Delta T$.

An object of this invention, therefore, is to improve isolation by reducing interdependence between successive measurements in an integrating type analog-to-digital converter.

Another object is to provide improved isolation between successive measurements in an integrating analog-to-digital converter of a type having an MOS input stage that has a tendency to retain a conversion residue between successive input signal measurements.

An additional object is to reduce measurement crosstalk between successive measurements in MOS type integrating analog-to-digital converters.

DISCLOSURE OF INVENTION

Isolation between successive measurements of an integrated analog-to-digital converter of a type having an MOS input stage is provided, in accordance with the invention, by applying between successive input signal measurements at least one preliminary, or "dummy", integration/de-integration cycle to "exercise" the input gate oxide layer and thereby cause sodium ions or other ions to shift in the oxide and settle in stable positions between the gate and channel of the MOS stage. The conversion cycle that follows the "dummy" cycle is thereby not contaminated by any unsettled charge in the gate oxide that otherwise would tend to shift the threshold of the amplifier. The "dummy" cycle is not used for precision measurement of the input signal since the "dummy" tends to be contaminated by ion shift induced in the gate oxide layer by the previous conversion conditions. Thus, means is provided for ignoring the measurement of the de-integration period of the dummy cycle and enabling measurement of the de-integration period of a subsequent conversion cycle.

The converter is zeroed after, or both before and after generation of at least one "dummy" cycle. Pre-zeroing of the converter causes the converter to null out coarse zero offsets in a conventional manner. Post-zeroing nulls relatively minor offsets incurred due to ion drift during execution of the dummy cycle.

In accordance with a preferred embodiment, the conversion cycle of an integrating analog-to-digital converter comprises a plurality of successive minor cycles each provided by (a) integrating the input signal for a predetermined first time period to obtain an integrated input signal and (b) de-integrating the integrated input signal toward a reference signal having a polarity opposite that of the input signal, as described in U.S. Pat. No. 4,556,867 assigned to the assignee of this invention. The de-integration times of the minor cycles are combined algorithmically to obtain a composite deintegration time that is proportional to the precise magnitude of the input signal. To reduce the effect of any measurement residue in the MOS input stage of the converter, a number of "dummy" minor cycles fewer than the number of minor cycles comprising a conversion cycle are executed to redistribute free ions in the input gate oxide and thereby "exercise" the oxide in accordance with the invention.

Still other objects and advantages of the present invention will become readily apparent to those skilled in this art from the following detailed description, wherein I have shown and described only the preferred embodiment of the invention, simply by way of illustration of the best mode contemplated by me of carrying out my invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIG. 6 is a circuit diagram of an integrating analog-to-digital converter using minor cycles in accordance with U.S. Pat. No. 4,556,867;

FIG. 7A is a graph of a pair of "dummy" minor cycles executed prior to a series of conversion minor cycles by the circuit of FIG. 6; and FIG. 7B is a graph showing conversion error in the system of FIG. 6 both with and without provision of "dummy" cycles.

BEST MODE FOR PRACTICING THE INVENTION

Figure 1:
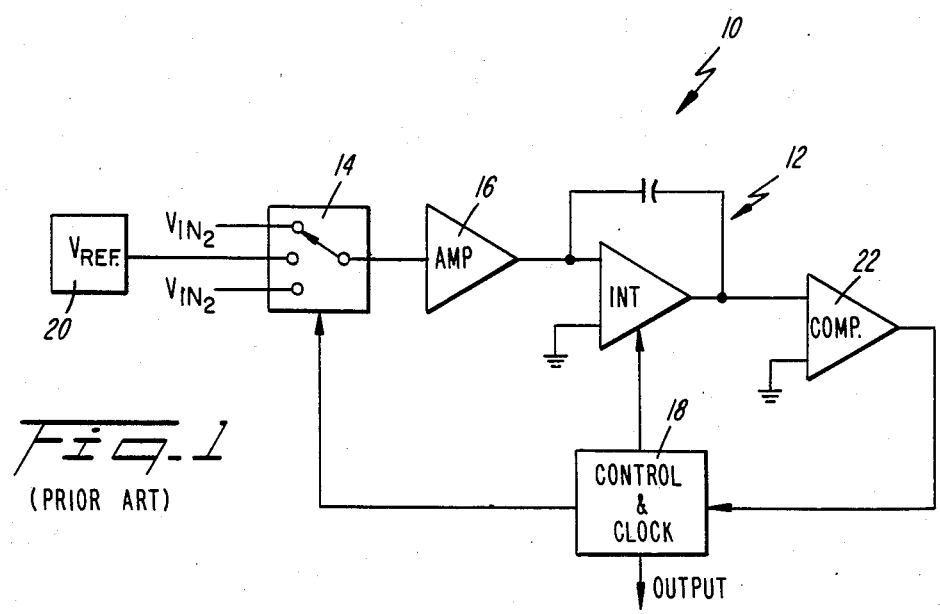
FIG. 1 is a simplified circuit diagram of a two-channel integrating digital-to-analog converter of the prior art.
Figure 2:
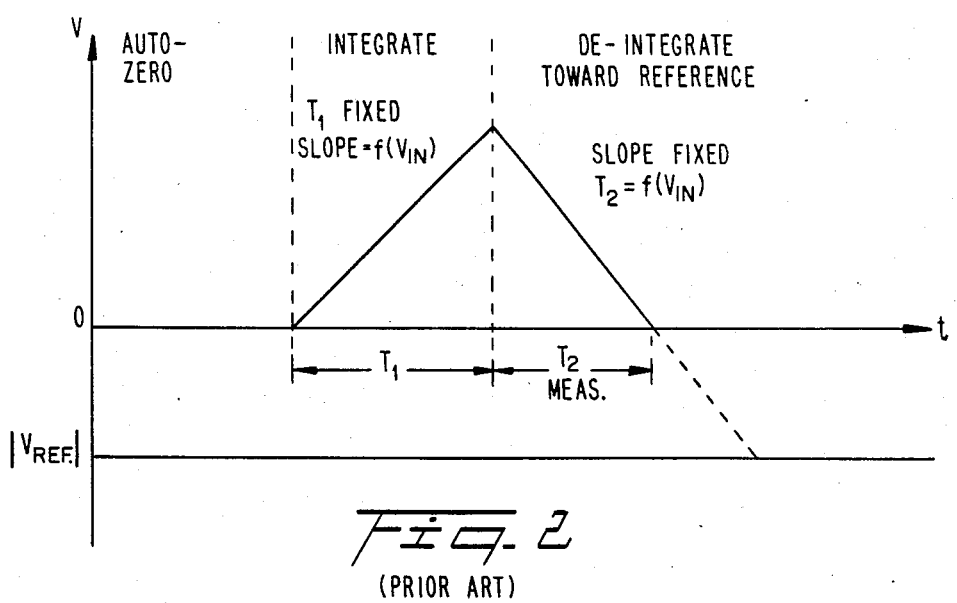
FIG. 2 is a graph of a conversion cycle executed by the circuit of FIG. 1.
Figure 5:
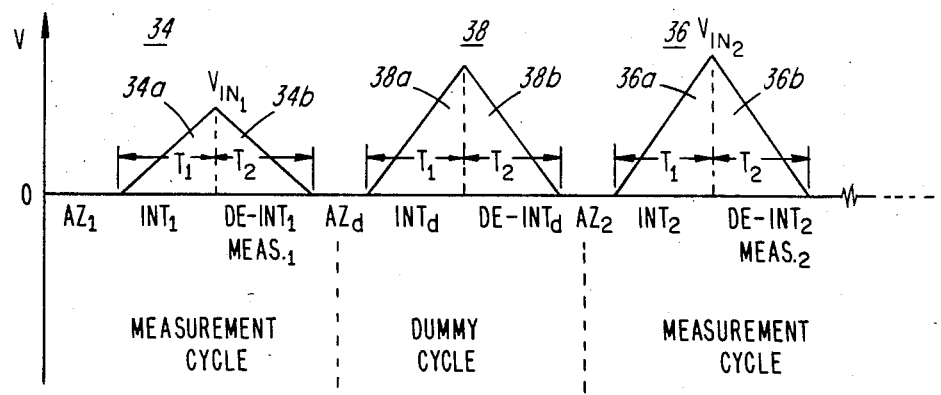
FIG. 5 is a graph of a "dummy" cycle executed between a pair of conversion cycles, in accordance with the invention.

In FIG. 5, a first conversion cycle 34 for measuring input signal $V_{in1}$ and a second conversion cycle 36 for measuring input signal $V_{in2}$ are isolated from each other by a "dummy" cycle 38 provided in accordance with the invention. The "dummy" cycle 38 reduces the influence of any measurement residue produced in the input gate oxide of the converter by the first conversion cycle 38 measuring $V_{in1}$ on the next conversion cycle measuring $V_{in2}$. To execute the standard conversion cycle 34, the control unit 18 of FIG. 1 controls input switch 14 to connect amplifier 16 to the first input signal $V_{in1}$, and, following auto-zero AZ, integrator 12 integrates the input signal $V_{in1}$ as shown by 34a. Following a predetermined fixed time interval $T_1$, switch 14 is controlled by unit 18 to connect amplifier 16 to the reference source $V_{ref}$ 20. $V_{ref}$ 20 has a polarity opposite that of $V_{in1}$ whereby integration of the reference signal establishes the deintegration or discharge portion of the conversion cycle identified by 34b. The de-integration time $T_2$ for the deintegration curve 34b to intersect ground level is measured to develop an input signal magnitude related count that is applied to a display or to other processing.

Figure 3:
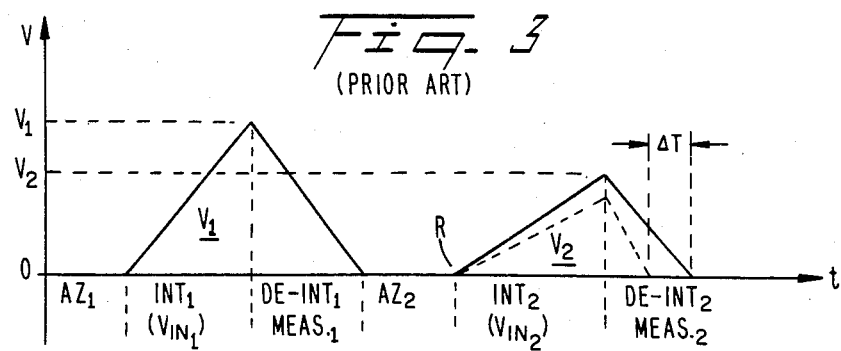
FIG. 3 is a graph of two consecutive conversion cycles corresponding to first and second channel measurements made by the circuit of FIG. 1, with a measurement residue extant in the second cycle.
Figure 4:
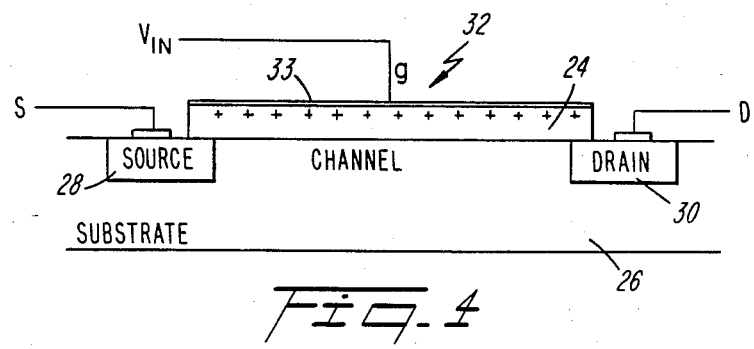
FIG. 4 is a cross-sectional view of an MOS device forming the input gate of the converter shown in FIG. 1.

Control unit 18 now controls switch 14 to interconnect amplifier 16 and the second input signal $V_{in2}$ to be measured. Switch 14 and integrator 12 execute a "dummy" cycle wherein, following auto-zero $AZ_d$, the integrator 12 integrates the input signal $V_{in2}$ for fixed time $T_1$ to obtain integration curve 38a. The switch 14 is now operated by control 18 to interconnect amplifier 16 and reference source $V_{ref}$ 20 to de-integrate as shown by curve 38b. During de-integration of the "dummy" cycle, however, the de-integration time is ignored. This is because the "dummy" cycle is presumed to be contaminated by unsettled charge residue imparted in the gate oxide of the input stage of amplifier 16 during conversion cycle 34 as explained with respect to FIG. 3. The "dummy" cycle 38 does, however, substantially eliminate the unsettled charge residue in the gate oxide by "exercising" the oxide whereby free ions tend to shift into a new stable distribution independent of any previous distribution established by the previous conversion upon input signal $V_{in1}$. Now, with switch 14 controlled by unit 18 to again interconnect amplifier 16 and input source $V_{in2}$, conversion cycle 36 consisting of an auto-zero $AZ_2$, an integration by $V_{in2}$ 36a and a de-integration by $V_{ref}$ 36b, is executed. The de-integration time $T_2$, proportional to the magnitude of input signal $V_{in2}$, is measured and displayed or further processed. The measurement of $V_{in2}$ during conversion cycle 36 is very accurate because any measurement residue by cycle 34 that would otherwise contaminate the new measurement is substantially eliminated by the "dummy" cycle 38.

As switch 14 is controlled by unit 18 to alternate between input channels to measure $V_{in1}$ and $V_{in2}$, alternate conversion cycles are isolated by dummy cycles as shown in FIG. 5 to isolate channel measurements.

Another embodiment of an integrating analog-to-digital converter 45 shown in FIG. 6 is of a type described in U.S. Pat. No. 4,556,867 and incorporated herein by reference in its entirety. A pair of input channels $V_1$, $V_2$ at 40 are applied alternately through sampling switch 42 to buffer amplifier 44 for integration by integrator 46. A reference source 48 having a polarity opposite that of input signal 40 is applied, through switch 50, to the buffer amplifier 44. Additional switches 52 and 54 apply, respectively, a ground potential to buffer 44 and a corresponding offset voltage to integrator 46 for auto-zeroing. Switches 42, 50, 52 and 54 are controlled by a control unit 56 to execute "minor" conversion cycles for measuring input signal $V_1$ or $V_2$, as described in U.S. Pat. No. 4,556,867. With the converter operating in a "precision" mode as discussed in the patent, the de-integration times associated with the minor cycles of each measurement are counted by clock 58, accumulated and processed algorithmically in accumulator 60 and displayed by 62.

In accordance with the present invention, at least one additional "dummy" minor cycle precedes each series of minor conversion cycles comprising an input signal measurement to provide isolation between successive channel measurements, i.e., alternate measurements of input signals $V_1$ and $V_2$.

Thus, referring to FIG. 7A, control unit 56 controls the converter 45 of FIG. 6 via switches 42, 50, 52 and 54 to precede each measurement series of minor conversion cycles by a number of "dummy" minor cycles. The buffer 44 during execution of the "dummy" minor cycles is connected to the signal source being next measured. Thus, assuming, for example, that signal source $V_2$ has been previously measured by circuit 45, buffer 44 is then connected to input source $V_1$. Prior to excution of minor conversion cycles to obtain the precision measurement of input signal $V_1$, an initial auto-zero $AZ_d$ is performed. This is followed by a pair of "dummy" minor cycles $D_1$ and $D_2$ to exercise the device gate oxides of 46 and 44. A second auto-zero $AZ_d$ is now performed followed by execution of the minor conversion cycles $C_1$-$C_n$ that comprise an input signal measurement.

During execution of "dummy" minor cycles $D_1$ and $D_2$, accumulator 60 is inhibited by control 56 from storing any de-integration counts, since the "dummy" minor cycles are presumed to be contaminated by an unsettled charge residue that has occurred during the previous input signal measurement. The accumulator 60 is, however, enabled during execution of conversion minor cycles $C_1$-$C_n$ to obtain a precision measurement of the input signal in accordance with U.S. Pat. No. 4,556,867.

FIG. 7B shows the effect of the "dummy" cycles on conversion offset error in the circuit of FIG. 6. Assuming first that no "dummy" cycles are provided, the dotted curve E represents offset as it shifts from that corresponding to a previous, lower magnitude, conversion cycle set to that of the current one. The offset requires several cycles of settling time to reach steady state corresponding to the stable positions of ions in the input device oxide in response to the current input voltages. It is observed that settling substantially occurs following two cycles. Thus, the provision of two "dummy" cycles as shown by the solid curve in FIG. 7B accelerates movement of the gate oxide ions to their stable positions corresponding to the current input voltage prior to execution of the measurement cycles to measure the current input voltage. The area between the dotted and solid curves represents accumulated offset error improvement as a result of the "dummy" cycles provided in accordance with the invention.

There accordingly has been described a method of and circuitry for providing measurement channel isolation in an integrating analog-to-digital converter having an MOS input stage that tends to retain residue from a previous measurement as a result of free sodium ions in the oxide layer and other effects in the stages of the converter. Although the principles of this invention are described herein by way of an example in multi-channel measurement wherein input signal levels tend to differ significantly between channels, it is understood that the invention is not limited to multiple channel measurement but is more broadly applicable to any MOS type integrating analog-to-digital converters wherein successive input samples have significant magnitude differences that tend to become subject to contamination by ion migration in the oxide layer of the MOS devices. Furthermore, although I have determined empirically that two "dummy" cycles in the method of this invention are preferred (see FIG. 7B) since settling of ions in their stable positions in the input device oxide substantially occurs therefrom, other numbers of "dummy" cycles could be provided.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

I claim:

1. In an integrating analog-to-digital converter for measuring successive discrete input signals using conversion cycles each comprising (a) integrating the input signal for a predetermined fixed first time period to obtain an integrated input signal and (b) de-integrating said integrated input signal toward a reference input signal; measuring a de-integration time for de-integrating the integrated input signal to a reference level intermediate said input signal and said reference signal and correlating said de-integration time to an input signal magnitude, wherein an input stage of said converter to which said input signals are successively applied is a metal-oxide-silicon linear amplifier having an input gate oxide that as a result of ionic contamination and other effects has a tendency to exhibit crosstalk between successive input signal measurements:

a method of reducing said crosstalk comprising, between successive input signal measurements, the steps of "exercising" said input gate oxide by applying to said amplifier an input signal having a magnitude substantially equal to that of an expected input signal to be measured by said converter and executing a preliminary conversion cycle consisting of (a) and (b).

2. The method of claim 1, including the step of zeroing said converter prior to executing said preliminary cycle.

3. The method of claim 1, including the step of zeroing said converter after executing said preliminary cycle.

4. The method of claim 1, including the steps of zeroing said converter before and after executing said preliminary cycle.

5. The method of claim 1, wherein said discrete input signals are obtained from different signal sources.

6. The method of claim 5, wherein said signal sources are comprised of two sources and signals from said two sources are applied alternately to said converter.

7. The method of claim 1, wherein said input signal to be measured is applied to said converter for execution of said preliminary conversion cycle.

8. The method of claim 1, comprising executing two successive preliminary cycles.

9. The method of claim 1, comprising executing at least two successive preliminary cycles.

10. In an integrating analog-to-digital converter comprising an input terminal for receiving successive discrete input signals to be measured, a source of a reference signal having a polarity opposite that of said input signal, integrator means, means for controlling said integrator means to operate in a conversion cycle (a) integrating an input signal for a first fixed time period to obtain an integrated input signal means and then (b) de-integrating said integrated input signal toward said reference signal, and means for measuring a second time period for said integrated input signal to be deintegrated to a reference level intermediate said input signal and said reference signal, said second time period corresponding to the magnitude of the input signal being measured, wherein an input stage of said converter comprises a metal-oxide-silicon linear amplifier having an input gate oxide that as a result of ionic contamination and other effects has a tendency to exhibit crosstalk between successive measurements, circuitry for reducing said crosstalk, comprising:

means for inhibiting an output of said measuring means while controlling said integrator means to operate in a first, preliminary conversion cycle consisting of (a) and (b);

means for enabling an output of said measuring means while controlling said integrator means to operate in a second, measurement conversion cycle consisting of (a) and (b); and means for responding to an output of said measuring means.

11. In an integrating analog-to-digital converter for measuring successive discrete input signals wherein each input signal is measured using a conversion cycle comprising a plurality of successive minor cycles each provided by (a) integrating the input signal for a predetermined fixed first time period to obtain an integrated input signal, (b) de-integrating said integrated input signal toward a reference signal having a polarity opposite that of the input signal, (c) measuring a de-integration time for said integrated input signal to be de-integrated to a reference level intermediate said input signal and said reference signal, a plurality of de-integration times for said minor cycles associated with said conversion cycle being combined to obtain a composite de-integration time that is proportional to the magnitude of said input signal, wherein an input stage of said converter to which said input signals are successively applied is a metal-oxide-silicon linear amplifier having an input gate oxide that as a result of ionic contamination and other effects has a tendency to exhibit crosstalk between successive input signal measurements, a method of reducing said crosstalk, comprising, between successive input signal measurements comprising:

executing portions (a) and (b) of a number of additional minor cycles fewer than said plurality to "exercise" said input gate oxide while inhibiting measurement of associated de-integration times.

* * * * *